United States Patent
Matsumoto

(10) Patent No.: US 6,427,763 B2
(45) Date of Patent: Aug. 6, 2002

(54) AIR RECTIFICATION BLADES

(75) Inventor: Kaoru Matsumoto, Kitasaku-gun (JP)

(73) Assignee: Minebea Co., Ltd., Kitasaku-gun ( * ) Notice: Subject to any disclaimer, the term of this patent is extended or adjusted under 35 U.S.C. 154(b) by 0 days.

(21) Appl. No.: 09/907,597

(22) Filed: Jul. 19, 2001

(30) Foreign Application Priority Data

Jul. 25, 2000 (JP) ....................................... 2000-223696

(51) Int. Cl.[7] .................................................. H05K 7/20
(52) U.S. Cl. ..................... 165/80.3; 165/120; 415/211.2
(58) Field of Search ............... 165/80.3, 121, 165/185; 361/697, 704, 710; 174/16.3

(56) References Cited

U.S. PATENT DOCUMENTS

| | | | | |
|---|---|---|---|---|
| 2,154,313 A | * | 4/1939 | McMahon | 415/181 |
| 4,971,143 A | * | 11/1990 | Hogan | 123/41.49 |
| 5,327,956 A | * | 7/1994 | Bolton et al. | 165/121 |
| 5,466,120 A | * | 11/1995 | Takeuchi et al. | 415/119 |
| 5,828,551 A | * | 10/1998 | Hoshino et al. | 165/80.3 |
| 6,140,571 A | * | 10/2000 | Kitahara et al. | 165/185 |
| 6,206,635 B1 | * | 3/2001 | Golm et al. | 415/193 |

FOREIGN PATENT DOCUMENTS

| | | | | | |
|---|---|---|---|---|---|
| JP | 62070698 A | * | 4/1987 | ........... | F04D/29/54 |
| JP | 10066305 A | * | 3/1998 | ............ | H02K/9/06 |
| JP | 10154889 A | * | 6/1998 | ............ | H05K/7/20 |
| JP | 2000114443 A | * | 4/2000 | ......... | H01L/23/467 |

* cited by examiner

Primary Examiner—Allen Flanigan
(74) Attorney, Agent, or Firm—Oliff & Berridge, PLC

(57) ABSTRACT

To enhance a cooling efficiency of a cooling device using an axial fan motor, air rectification blades 1 are provided with hooks 1e engaged with a flange 2b of an axial fan motor 2 for fixing the air rectification blades 1 to the axial fan motor 2. The attachment/detachment of the air rectification blades 1 to the axial fan motor 2 is performed in a so-called one-touch manner without using any tool or jig by flexing the hooks 1e. It is possible to obtain the axial fan motor provided with the air rectification blades having optimum characteristics by attaching/detaching the air rectification blades 1 in the one-touch manner in a situation where the air rectification blades 1 are needed later for the axial fan motor not provided with any air rectification blades or the characteristics of the air rectification blades 1 are to be changed.

9 Claims, 4 Drawing Sheets

AIR RECTIFICATION BLADES

BACKGROUND OF THE INVENTION

1. Field of the Invention

The present invention relates to a technology to increase efficiency of cooling on a cooling device in which an axial fan motor is used.

2. Description of the Related Art

In general, a heat sink is used for effectively discharging heat out of semiconductors or the like in electronic equipment such as a personal computer or the like. Also, in order to forcibly cool the heat sink, an axial fan motor is used.

However, since the axial fan motor is provided with a motor in its central portion, the flow rate of air at the central portion is reduced in comparison with the peripheral portion of the axial fan motor so that the heat sink as a whole can not be uniformly cooled. Additionally, since the air flow from the axial fan motor forms a swirl, it is also difficult to feed cooling air sufficiently to deep portions of cooling fins of the heat sink.

Accordingly, where it is known in advance that the cooling capacity of the axial fan motor would be insufficient, the air flow from the axial fan motor is controlled so that the air flow becomes uniform. In addition, in order to provide the air without a swirl flow, an axial fan motor provided integrally with air rectification blades is used.

However, where the situation occurs in which a axial fan motor without air rectification blades is replaced by an axial fan motor provided with air rectification blades due to a later requirement to avoid the insufficiency of the cooling capacity, the replacement cost for the axial fan motors becomes high. Also, even if the axial fan motor provided in advance with the air rectification blades is used, where it is necessary to change the shape of the blade of the air rectification blades later, it is necessary to replace the axial fan motor as a whole, resulting in the same problem.

Also, it is necessary to manufacture a housing specialized for a shape of each blade needed for the axial fan motor provided with air rectification blades. Where such a housing is molded of resin, there is a problem that many kinds of molds are needed.

SUMMARY OF THE INVENTION

The present invention has been made in view of the foregoing difficulties, and therefore has an object to provide air rectification blades for later controlling the flow rate of the air from an axial fan motor as desired to thereby enhance a cooling efficiency of a cooling device using the axial fan motor. Also, another object of the present invention is to reduce cost by reducing the number of dies for the axial fan motor.

In order to attain these and other objects, according to a first aspect of the present invention, there are provided air rectification blades for controlling a flow rate of air from an axial fan motor, comprising an engagement portion that enables the air rectification blades to selectively attach to or detach from the axial fan motor. Then, the desired flow rate of air is controlled by selectively attaching or detaching the air rectification blades to or from the axial fan motor that has not been provided with any air rectification blades.

The air rectification blades according to a second aspect of the present invention further comprise an engagement portion that enables the air rectification blades to directly attach to a heat sink. Accordingly, a rectified blow of air is brought to the heat sink by a cooling device comprising an axial fan motor not provided with any air rectification blades and air rectification blades, thereby cooling the heat sink directly.

In the air rectification blades according to a third aspect of the present invention, the heat sink is used for cooling semiconductors. Accordingly, the rectified blow of air is brought to the heat sink by a cooling device comprising an axial fan motor not provided with any air rectification blades and the air rectification blades, thereby cooling the heat sink directly and enhancing the cooling efficiency of the semiconductors.

In the air rectification blades according to a fourth aspect of the present invention, the engagement portion is provided with a one-touch attachable/detachable mechanism. Namely, the attachment/detachment of the air rectification blades to the axial fan motor or the attachment/detachment of the air rectification blades to the heat sink are performed without using any tool or jig, thereby enhancing the later detachability/attachability.

In the air rectification blades according to a fifth aspect of the present invention, the air rectification blades have a contour continuous with the axial fan motor. It is therefore possible to receive the assembly substantially in the same space for that of the prior axial fan motor provided with the air rectification blades.

The air rectification blades according to a sixth aspect of the present invention may further comprise rectification plates taking on a uniform thickness vane shape. Then, in the case where the rectification plates are made of resin, it is possible to simplify the shape of the portion of the molds for forming the rectification plates.

The air rectification blades according to a seventh aspect of the present invention may further comprise rectification plates taking on a wing shape. With such blade shape rectification plates, the vane strength of the rectification plates is enhanced. Also, the generation of sound or vibration when the air passes through the rectification plates is suppressed.

DESCRIPTION OF THE PREFERRED EMBODIMENTS

An embodiment of the present invention will now be described with reference to the accompanying drawings.

Figure 1A:
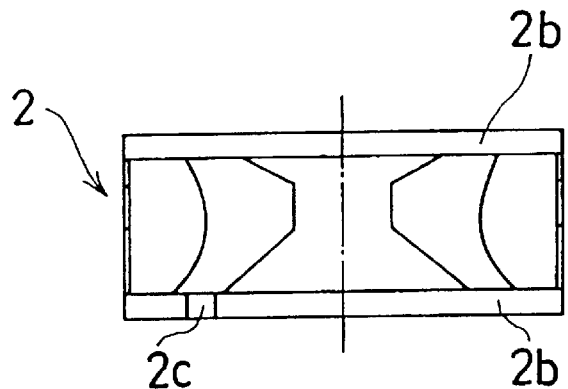
FIG. 1A is a side elevational view showing an axial fan motor on which air rectification blades according to an embodiment of the present invention are to be mounted.
Figure 1B:
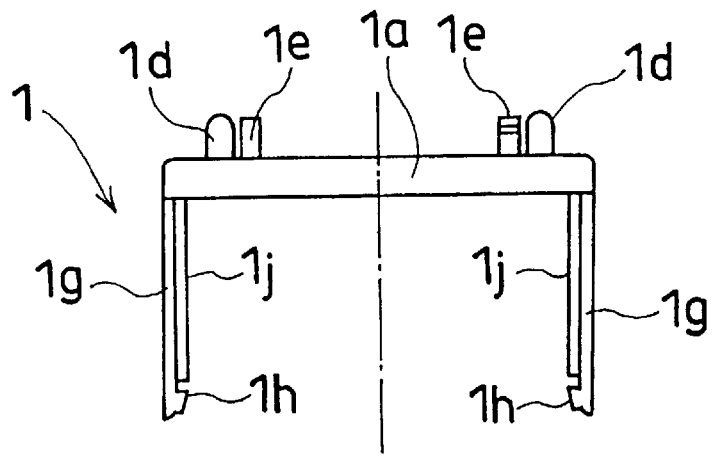
FIG. 1B is a side elevational view showing the air rectification blades according to the embodiment of the present invention.
Figure 1C:
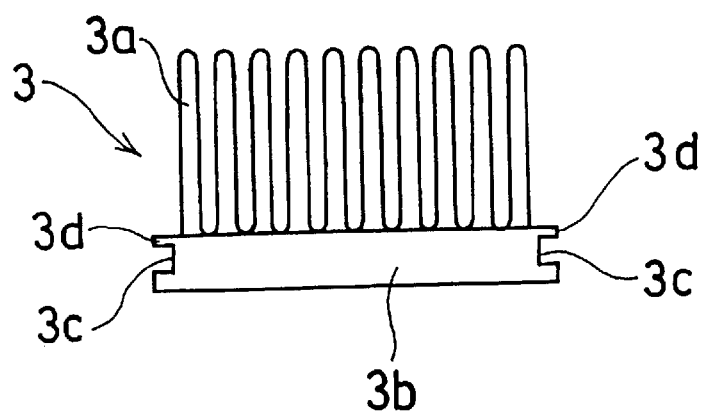
FIG. 1C is a side elevational view showing a heat sink on which the air rectification blades are to be mounted.

FIG. 1B, FIG. 1A and FIG. 1C are side sectional views showing air rectification blades 1 in accordance with the embodiment of the present invention, an axial fan motor 2 used with air rectification blades 1 (the axial fan motor is originally not provided with any air rectification blades) and a heat sink 3 to which air rectification blades 1 are directly mounted (for cooling semiconductors), respectively.

Figure 2A:
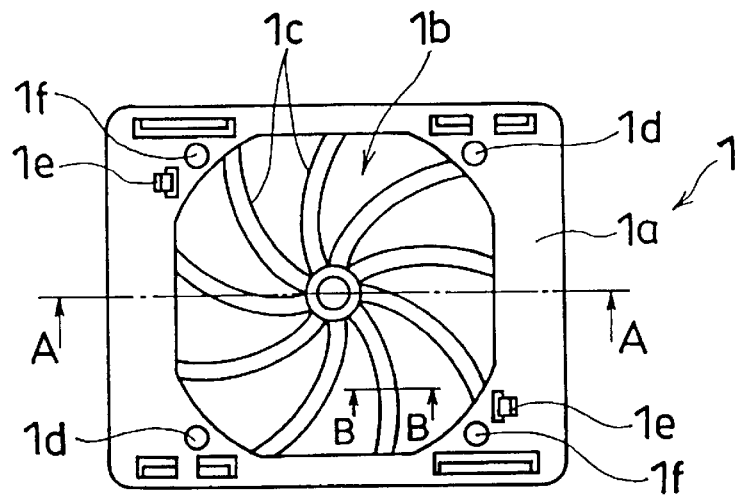
FIG. 2A is a top plan view showing the air rectification blade shown in FIG. 1B.
Figure 2B:
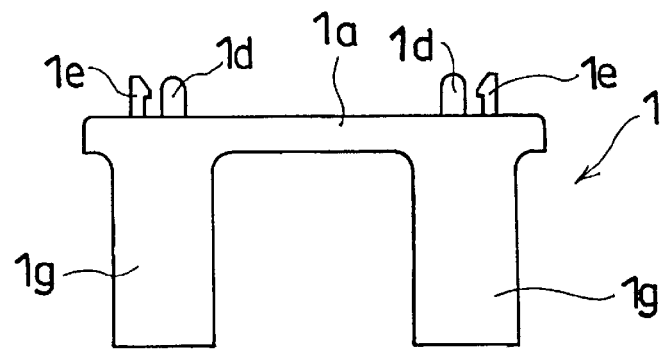
FIG. 2B is a front view showing the air rectification blades.
Figure 2C:
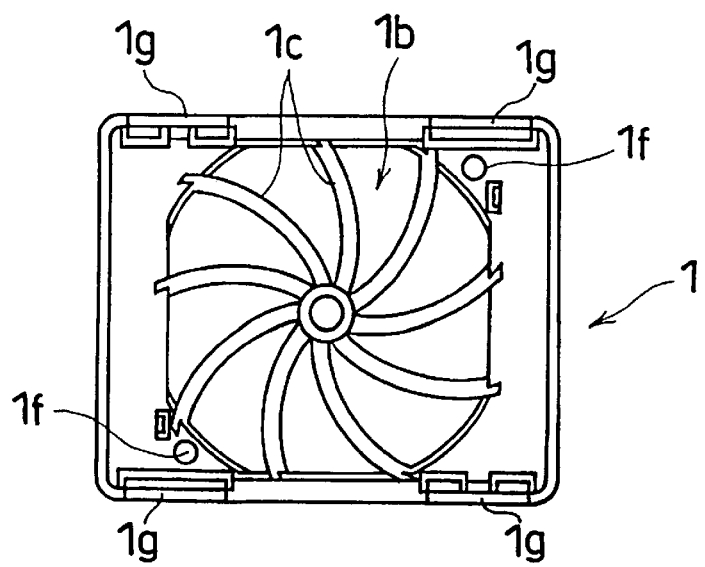
FIG. 2C is a bottom view showing the air rectification blades.
Figure 3:
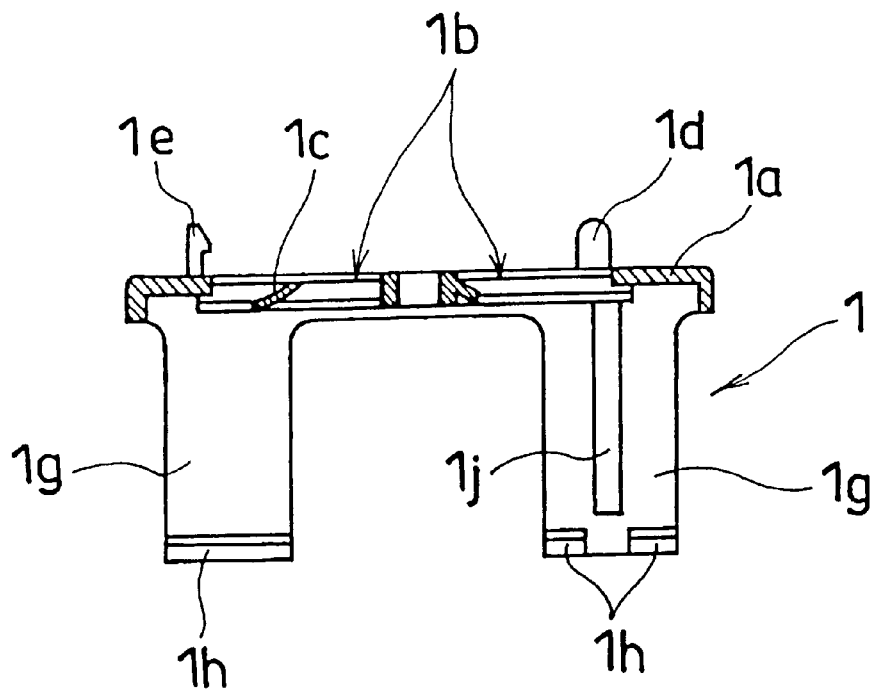
FIG. 3 is a cross-sectional view showing the air rectification blades taken along the line A—A of FIG. 2A.
Figure 5:
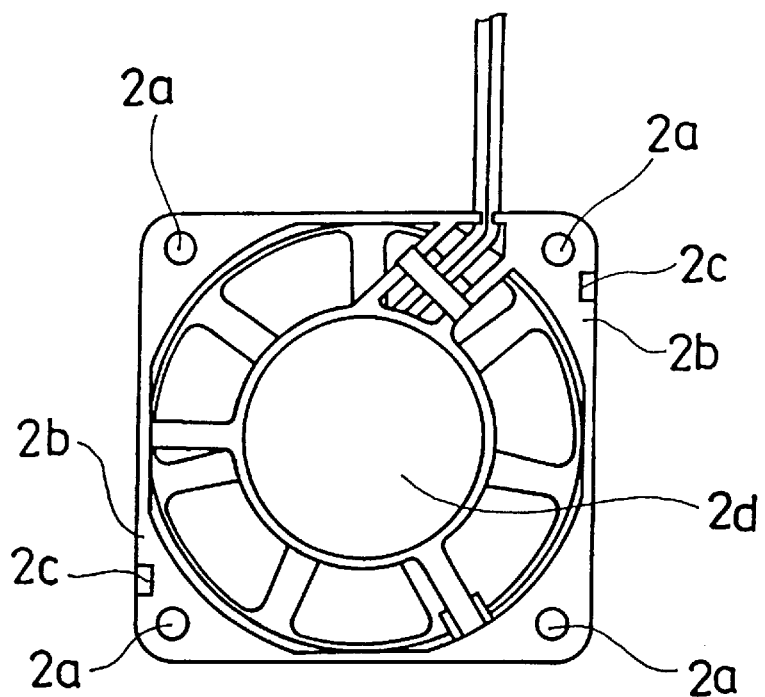
FIG. 5 is a view showing the axial fan motor shown in FIG. 1A as viewed in a direction in which the fan motor is in intimate contact with the air rectification blades.

FIG. 2A, FIG. 2B and FIG. 2C are a top plan view, a front view and a bottom view of the air rectification blades 1, respectively. FIG. 3 is a cross-sectional view of the air rectification blades 1 taken along the line A—A of FIG. 2A. Also, FIG. 5 shows a state of the axial fan motor 2 as viewed in a direction in which the latter is in intimate contact with the air rectification blades 1.

The air rectification blades 1 in accordance with the embodiment of the present invention are made of elastically deformable material such as synthetic resin or the like. An opening 1b is formed in a base portion 1a that is to be brought into contact with the axial fan motor 2. A plurality of rectification plates 1c are provided radially in the opening 1b. An engagement portion that enables the air rectification blades 1 to selectively detach from or attach to the axial fan motor 2 is formed in the base portion 1a.

The engagement portion is provided with pins 1d engaged with mounting holes 2a (see FIG. 5) of the axial fan motor 2 for the mutual positioning function and hooks 1e engaged with a flange 2b (see FIG. 5) of the axial fan motor 2 for fixing air rectification blades 1 to the axial fan motor 2. Incidentally, grooves 2c for engagement with the hooks 1e may be provided in the flange 2b in the axial fan motor 2. Also, screw holes 1f for fixing the air rectification blades 1 and the axial fan motor 2 to the heat sink 3 are provided at positions in alignment with the mounting holes 2a of the axial fan motor 2, if necessary.

Incidentally, although two pins 1d and two hooks 1e are used in this embodiment, it is possible to increase or decrease the numbers thereof within the range where the air rectification blades 1 may be positively mounted on the fan motor 2.

Also, an engagement portion that may be engaged directly with the heat sink 3 is provided in the base portion 1a. The engagement portion includes legs 1g, claws 1h formed at inner tip end portions of the legs 1g and ribs 1j formed on inner surfaces of the legs 1g. The legs 1g have a length such that the tip end portions of cooling fins 3a are located in the vicinity of a lower surface of the base portion 1a without contacting the latter when the air rectification blades 1 are mounted on the heat sink 3 (see FIG. 6). Also, the claws 1h are engaged with grooves 3c provided in a base 3b of the heat sink 3. Then, projections 3d of the base 3b are engaged with the gaps between the claws 1h and the ribs 1j whereby the fixture of the air rectification blades 1 to the heat sink 3 may be ensured both in the depression direction and the draw-out direction.

Incidentally, although four legs 1g are used in this embodiment, it is possible to increase or decrease the number thereof within a range such that the mounting of the air rectification blades 1 onto the heat sink 3 may be ensured.

Figure 4A:
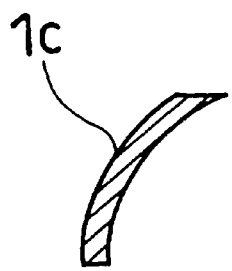
FIG. 4A is a cross-sectional view showing a rectification plate having a uniform thickness vane shape taken along the line B—B of FIG. 2A.
Figure 4B:
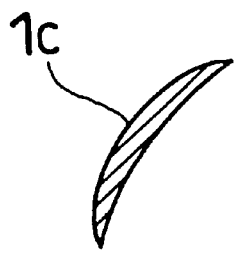
FIG. 4B is a cross-sectional view showing a rectification plate having a wing shape taken along the line B—B of FIG. 2A.

Cross-sectional shapes of the rectification plate 1c of the air rectification blades 1 taken along the line B—B of FIG. 2A are exemplified in FIGS. 4A and 4B. The rectification plate 1c shown in FIG. 4A has a uniform thickness vane shape in cross section. With such a shape, in the case where the air rectification blades 1 are molded of resin by using molds, it is possible to simplify the shape of the portions of the dies for molding the rectification plates, thereby reducing the cost for the dies.

Also, the rectification plate 1c shown in FIG. 4B has a wing shape in cross section. With such a shape, it is possible to enhance the vane strength of the rectification plate 1c. Also, it is possible to suppress the generation of sound or vibration when the blow of air of the axial fan motor 2 passes through the rectification plate 1c.

Figure 6:
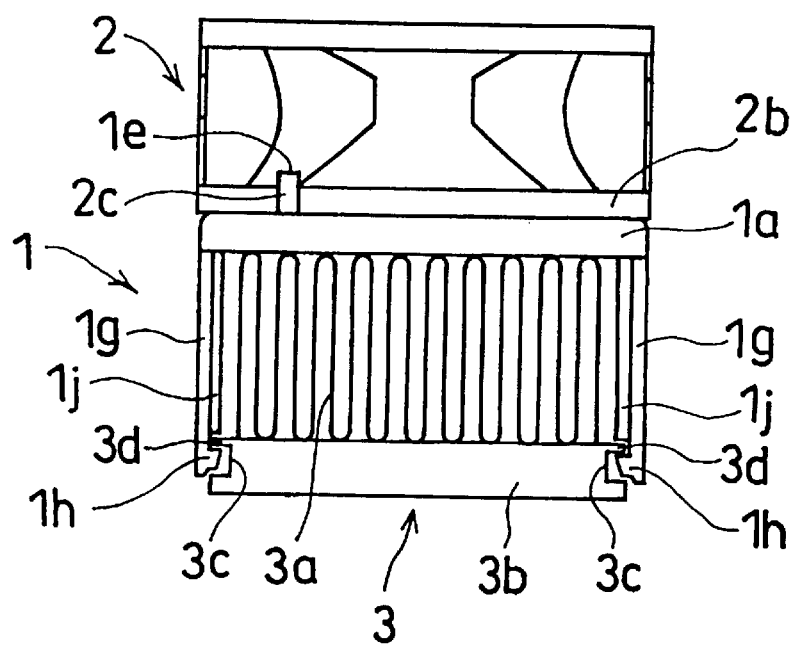
FIG. 6 is a side elevational view showing the air rectification blades according to the embodiment of the present invention mounted on the axial fan motor and the heat sink.

FIG. 6 is a side elevational view showing air rectification blades 1 mounted on the axial fan motor 2 and the heat sink 3. As shown in the figure, the air rectification blades 1 according to the embodiment of the present invention have a contour continuous with the axial fan motor 2. Accordingly, it is possible to receive the axial fan motor substantially in the same space for the prior axial fan motor with air rectification blades.

The advantage obtained by the air rectification blades in accordance with the foregoing embodiment with such a structure is as follows. First of all, as the engagement portion that enables the air rectification blades 1 to selectively detach from or attach to the axial fan motor 2, the air rectification blades 1 are provided with the pins 1d engaged with the mounting hole 2a (see FIG. 5) of the axial fan motor 2 and the hooks 1e engaged with the flange 2b (see FIG. 5) of the axial fan motor 2 for fixing the air rectification blades 1 to the axial fan motor 2. Since the air rectification blades 1 are made of elastically deformable material, the hooks 1e are deflected so that the attachment/detachment of the air rectification blades 1 to the axial fan motor 2 may be performed in a so-called one-touch manner without using any tool or jig.

Accordingly, in situations where it is necessary to later mount the air rectification blades 1 to the axial fan motor 2 not provided with any air rectification blades or there is a desire to change the characteristics of the air rectification blades 1, the air rectification blades 1 are attached/detached in the one-touch manner to thereby obtain the axial fan motor provided with air rectification blades having optimum characteristics. Accordingly, the air rectification blades 1 in accordance with the embodiment of the present invention are selectively attached to or detached from the axial fan motor 2 not provided with any air rectification blades whereby it is possible to control the desired flow rate of air using the axial fan motor 2 that has a high generality.

Accordingly, with air rectification blades 1 according to the embodiment of the present invention, it is possible to enhance the cooling efficiency of the cooling device using the axial fan motor 2.

Also, since the general fan motor not provided with any air rectification blades is used as the axial fan motor 2, it is unnecessary to prepare a number of kinds of molds for molding the housing of the axial fan motor in response to the characteristics of the air rectification blades, making it possible to reduce the cost for the dies.

Also, the air rectification blades 1, as the engagement portion that enables it to directly attach to the heat sink 3, are provided with the legs 1g, the claws 1h formed at the inner tip end portions of the legs 1g and the ribs 1j formed on the inner surfaces of the legs 1g. Then, the claws 1h are engaged with the grooves 3c provided in the base 3b of the heat sink 3 whereby it is possible to mount the air rectification blades 1 onto the heat sink 3 in the so-called one-touch manner.

As shown in FIG. 5, since the axial fan motor 2 is provided with a motor 2d at its central portion, the flow rate of air from the axial fan motor 2 is small at the central portion in comparison with the peripheral portion. However, by mounting the air rectification blades 1 onto the axial fan motor 2, the flow rate of air is made uniform. The flow of air from the axial fan motor 2 forms the swirl flow but this becomes a non-swirl flow by the air rectification blades 1. Accordingly, it is possible to feed a sufficient amount of cooling air uniformly over the entire portion of the heat sink 3 to the deepest portion of the cooling fins 3a to perform an effective cooling.

Incidentally, since the heat sink 3 is used for cooling semiconductors, it is possible to later enhance the cooling efficiency by using air rectification blades 1 in accordance with the embodiment of the present invention.

Furthermore, since air rectification blades 1 have the outer contour continuous with the axial fan motor 2, under the condition that air rectification blades 1 are mounted on the axial fan motor 2 and the heat sink 3 as shown in FIG. 6, it is possible to receive the assembly substantially in the same space as that for the prior axial fan motor provided with air rectification blades.

Incidentally, where the rectification plates 1c of the air rectification blades 1 take on the uniform thickness vane shape, it is possible to simplify the shape of the portion of the resin molding molds for forming the rectification plates and to reduce the cost for the dies. Also, where rectification plates 1c of the air rectification blades 1 take on the wing shape, it is possible to enhance the vane strength of the rectification plates 1c and to enhance the strength of the air rectification blades 1. Also, by making the rectification plates 1c into the wing shape, it is possible to reduce the generation of sound or vibration when the air passes through the rectification plates 1c and to avoid the degradation of the acoustic characteristics caused by using the air rectification blades 1.

Incidentally, the engagement portion, for the heat sink 3, including the legs 1g, the claws 1h formed at the inner tip end portions of the legs 1g and the ribs 1j formed in the inner surfaces of the legs 1g is not essential in the air rectification blades 1 according to the present invention. If the air rectification blades 1 from which the engagement portion is removed (not shown in the figure) are used and mounted on the axial fan motor 2, it is possible to provide a cooling device having a high generality with no limitations to the objects to be cooled. Also, the contour of the air rectification blades 1 is not limited to the one continuous with the axial fan motor 2.

The air rectification blades with the structure according to the present invention as described above exerts the following effects. First of all, with the air rectification blades according to the first aspect of the present invention, it is possible to later control the desired flow rate of air from the axial fan motor and to enhance the cooling efficiency of the cooling device using the axial fan motor. Also, it is possible to reduce the cost by reducing the type of dies for the axial fan motor.

Also, with the air rectification blades according to the second aspect of the present invention, it is possible to later enhance the cooling efficiency of the heat sink. Also, with the air rectification blades according to the third aspect of the present invention, it is possible to later enhance the cooling efficiency of the semiconductors.

Furthermore, with the air rectification blades according to the fourth aspect of the present invention, it is possible to attach or detach the air rectification blades to or from the axial fan motor without using any tool or jig, or to attach or detach the air rectification blades to or from the heat sink to later enhance the detachability, attachability or the assembling property, thereby readily enhancing the cooling efficiency of the cooling device using the axial fan motor.

Also, with the air rectification blades according to the fifth aspect of the present invention, it is possible to receive the assembly substantially in the same space as that for the prior axial fan motor provided with air rectification blades, to facilitate the addition of the air rectification blades and to later enhance the cooling efficiency of the cooling device using the axial fan motor.

Also, with the air rectification blades according to the sixth aspect of the present invention, it is possible to reduce the cost of dies for the rectification plates. Furthermore, with the air rectification blades according to the seventh aspect of the present invention, it is possible to enhance the vane strength of the rectification plates and to enhance the strength of the air rectification blades. Also, the generation of sound or vibration is suppressed when the air passes through the rectification plates, whereby it is possible to avoid the degradation of the acoustic characteristics caused by using the rectification plates.

What is claimed is:

1. Air rectification blades for controlling a flow direction from an axial fan motor, comprising:

a base portion having an opening;

a plurality of rectifier plates mounted radially in said opening;

a plurality of leg portions disposed on a first side of said base portion, each leg portion of said plurality of leg portions having an engagement portion formed at an end portion of said each leg portion to removably attach with a member; and a determining position member and an engagement member mounted on a second side of said base portion, wherein said engagement member is removably attachable to the axial fan motor.

2. Air rectification blades according to claim 1, wherein said determining position member is a pin.

3. Air rectification blades according to claim 1, wherein said engagement member and said engagement portion are provided with a one-touch attachable/detachable mechanism by a hook.

4. Air rectification blades according to claim 1, wherein said leg portions are formed integrally with said base portion.

5. Air rectification blades according to claim 1, wherein a rib is formed on an inner surface of said each leg portion.

6. Air rectification blades according to claim 1, wherein a screw hole for mounting the axial fan motor is formed on said base portion.

7. Air rectification blades according to claim 1, wherein said base portion and said leg portions are made of an elastic material.

8. Air rectification blades according to claim 7, wherein said elastic material is a synthetic resin.

9. Air rectification blades according to claim 1, wherein said member is a heat sink.

* * * * *